United States Patent [19]
Gordon

[11] Patent Number: 5,492,725
[45] Date of Patent: Feb. 20, 1996

[54] PROCESS FOR CHEMICAL VAPOR DEPOSITION USING PRECURSOR COMPOUNDS CONTAINING HYDROPYRIDINE LIGANDS

[76] Inventor: Roy G. Gordon, 22 Highland St., Cambridge, Mass. 02158

[21] Appl. No.: 344,458

[22] Filed: Nov. 23, 1994

[51] Int. Cl.[6] .............................. C23C 16/00; H01B 1/00
[52] U.S. Cl. ...................... 427/248.1; 427/250; 427/124; 427/126.1; 252/512; 252/518
[58] Field of Search .................................. 427/248.1, 249, 427/250, 255, 255.1, 255.2, 255.6, 124, 126.1; 252/512, 518

[56] References Cited

U.S. PATENT DOCUMENTS

| | | | |
|---|---|---|---|
| 4,292,394 | 9/1981 | Chu et al. | 427/201 |
| 4,301,196 | 11/1981 | McCormack et al. | 427/345 |
| 5,110,384 | 5/1992 | Dudek et al. | 427/126.2 |
| 5,139,999 | 8/1992 | Gordon et al. | 427/255.2 |

*Primary Examiner*—Roy V. King
*Attorney, Agent, or Firm*—Samuels, Gauthier & Stevens

[57] ABSTRACT

Chemical vapor deposition (CVD) is accomplished by the reaction of vapors of certain novel compounds containing ligands derived from partially hydrogenated aromatic nitrogen-containing heterocyclic compounds. For example, tetrakis(1,4-dihydropyridinato)titanium reacts at 400° C. to deposit films containing titanium metal. These films show good conformality, electrical conductivity and are suitable as a contact and adhesion layers in semiconductor microelectronics. Similar compounds containing 1,4-dihydropyridinato ligands can be used as CVD sources for a wide variety of elements, including metals, semiconductors and non-metals.

12 Claims, No Drawings

PROCESS FOR CHEMICAL VAPOR DEPOSITION USING PRECURSOR COMPOUNDS CONTAINING HYDROPYRIDINE LIGANDS

FIELD OF THE INVENTION

This invention relates in general to the chemical vapor deposition (CVD) of materials, particularly in the form of thin films. Their applications include coatings which are electrically conductive, optically reflective, transparent, wear-resistant, decorative, and/or corrosion-resistant. CVD processes are widely employed by industry to make a great variety of products, including computer microcircuits, solar cells, energy-conserving window coatings, wear-resistant machine tools, optical fibers, jewelry etc.

In the process of CVD, reactant compounds are converted to the desired product materials. This patent discloses novel compounds which are useful as reactants for CVD processes.

BACKGROUND OF THE INVENTION

Titanium is an example of one of the metals which has found widespread use as an electrically conductive layer in semiconductor microelectronic circuits. Titanium is used in microelectronic devices to provide low-resistance electrical contact to materials, such as silicon or aluminum, which form a stable insulating oxide layer on their surface. Titanium also serves as a bonding agent between materials, such as silicon dioxide and tungsten, which otherwise do not bond strongly together.

As microelectronics manufacturers have attempted to make devices that operate faster and are less expensive, they have made narrower openings through which the metallic connections must pass through the insulating layers. In microelectronics the "aspect ratio" is defined as the ratio of the thickness of the insulator layer to the diameter of a hole or the width of a trench through the insulator. In current practice, aspect ratios of 1 or 2 are commonly used. In the next generation of devices, it is widely believed in the industry that aspect ratios of 3 or 4 or more will be used.

Sputtering is usually used to form the titanium and titanium nitride layers in computer processors, memories and other microcircuits. Although sputtering has been successful in coating devices with currently used aspect ratios, it is difficult for sputtering to coat uniformly devices with higher aspect ratios. Sputtering forms coatings which are thicker at the top surface and thinner on the bottoms and lower side walls of holes and trenches, and therefore, it is said that sputtering has poor "step coverage". While this difficulty of sputtering can be alleviated somewhat by collimating the sputtered material, this leads to other difficulties including poor sidewall coverage and high cost because of reduced coating rate and greater maintenance requirements.

An alternative coating process with good step coverage would thus be highly useful in semiconductor manufacture. Chemical vapor deposition processes sometimes show very good step coverage, and for this reason a CVD process for titanium having good step coverage, operating at low enough temperatures, and having relatively non-corrosive byproducts would be advantageous in the manufacture of semiconductor microcircuits.

The requirement for low temperatures is particularly important. In modern semiconductor designs several layers of metal interconnections are applied and titanium layers are often used to enhance electrical contact between these successive metal layers. Temperatures during the formation of these upper layers of metallization must be kept below about 400° C. in order to avoid thermal degradation of these structures. Unfortunately, there are no prior art CVD processes for depositing titanium that meet all these requirements.

There have been a number of attempts to form titanium by chemical vapor deposition from a number of different reactants. The reaction of titanium tetrahalides with molecular hydrogen is spontaneous only at very high temperatures, which would cause degradation of silicon semiconductor structures. Another difficulty with using this process for semiconductors is that some halogen is deposited as an impurity in the titanium. This residual halogen may cause corrosion of the metal layers. It may also be corrosive to the apparatus used, so that expensive materials of construction must be used.

A lower temperature CVD process for titanium is disclosed in German patent 1,117,964 (Nov. 23, 1961). This process involves the thermal decomposition of vapors of dicyclopentadienyl titanium at temperatures of 260° to 482.2° C. A similar process for depositing titanium, zirconium or hafnium has been proposed in European patent publication 0 468 396 A1 (Jul. 22, 1991) using compounds such as cycloheptatrienyl cyclopentadienyl titanium.

Silicon, a widely used semiconductor, is deposited from a variety of CVD sources, particularly silane, disilane and dichlorosilane, which are hazardous spontaneously flammable gases. It would be advantageous to have CVD sources for silicon which are not as hazardous as these gases.

Boron and phosphorus are added to silicon as impurities (called dopants) to increase its electrical conductivity. Diborane and phosphine are extremely poisonous gases which are used to provide dopants during CVD of silicon or silicon dioxide. It would be advantageous to have less toxic boron and phosphorus sources which also have lower vapor pressures, so that they could not be spread as easily by gas leaks.

Gallium arsenide is another useful semiconductor which is often made by a CVD process starting from arsine, an extremely toxic gas, and trimethylgallium, which is spontaneously flammable. It would be desirable to have less toxic arsenic sources with lower vapor pressures, and gallium sources which are not spontaneously flammable.

Aluminum is a metal that is useful in making interconnections in microcircuits. Currently known CVD aluminum sources include aluminum alkyls, which are spontaneously flammable and also leave carbon impurities in the aluminum, and aluminum hydride complexes, which are unstable when stored at room temperature. Because of these disadvantages, aluminum is not usually made by CVD. It would be desirable to have aluminum CVD sources which make pure metal, are not spontaneously flammable and are stable during storage.

SUMMARY OF THE INVENTION

It is one object of the invention to provide a process for the chemical vapor deposition of metals with excellent step coverage, at low temperatures and without corrosive contaminants or byproducts.

A particular object of this invention is a chemical vapor deposition process for depositing titanium-containing films in a manner that is suitable to their application as contact, diffusion barrier and adhesion layers in semiconductor microcircuits having holes and/or trenches with high aspect ratios.

A further object is to deposit semiconductor materials from sources that are less hazardous than commonly used materials.

A particular object is to provide a process for depositing silicon from source materials which are neither spontaneously flammable nor highly toxic.

Another object is to provide a means for depositing semiconductors such as gallium arsenide or indium phosphide without the use of highly toxic gases or spontaneously flammable liquids.

Other objects of the invention will be obvious to those skilled in the art on reading the instant invention.

In one preferred embodiment of the invention, vapors of certain compounds are brought to the surface of a heated substrate on which a metal or metal-containing layer then deposits. Optionally, the flow of the vapor may be diluted with an inert carrier gas, such as helium, neon, argon or nitrogen. The process may be carried out either at atmospheric pressure or at a reduced pressure. Air, water vapor and other oxygen-containing compounds are excluded from the vapor mixture.

In some cases, metalhydrides, rather than pure metals, may be deposited. If pure metals are desired, such metal hydride deposits may be heated to a high enough temperature in an inert atmosphere or in vacuum, so that the hydrogen is removed from the deposit. Alternatively, the amount of hydrogen in the deposit may be reduced by using a higher substrate temperature during the deposition.

In the practice of this invention, the preferred compounds contain at least one ligand formed from a partially hydrogenated aromatic nitrogen-containing heterocyclic compound. These ligands include the dihydropyridinato ligands

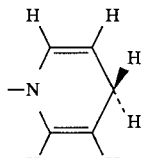 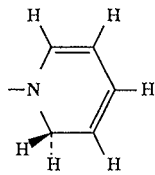

1,4-dihydropyridinato        1,2-dihydropyridinato which may be considered to be derived formally by adding two hydrogen atoms to the very stable aromatic heterocycle, pyridine:

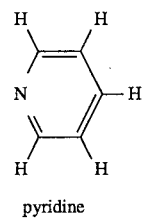

pyridine

These ligands may be removed from a molecule by reactions of the type:

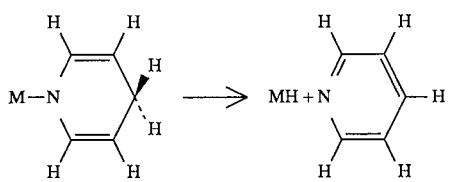

in which M stands for the remainder of the molecule to which the dihydropyridine ligand is attached. The thermodynamic driving force for this reaction is enhanced because these ligands become much more stable aromatic molecules after they give up their "extra" hydrogen to the remainder of the molecule. This reaction is rapid because this hydrogen motion is a process allowed by the Woodward-Hoffmann rules of organic chemistry.

The partially hydrogenated aromatic nitrogen-containing heterocyclic ligands may also include substituent radicals consisting of carbon, hydrogen and, optionally, other elements selected from a group consisting of nitrogen, phosphorus, silicon, sulfur, fluorine, chlorine, bromine and iodine.

One class of titanium-containing precursors having 1,4-dihydropyridinato ligands are compounds of the type:

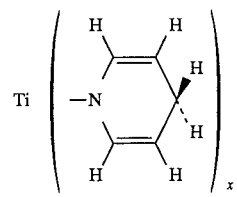

in which the integer x is typically 3 or 4. These materials have relatively low vapor pressures. They dissolve in organic solvents, such as pyridine or hydrocarbons. These solutions can be evaporated from tiny droplets of an aerosol to form a vapor source for chemical vapor deposition.

Higher vapor pressures can be achieved by including other ligands,

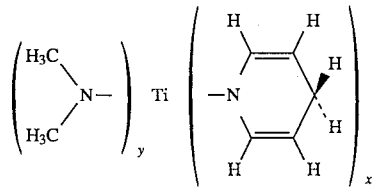

in which x and y are integers.

Substituting 1,2-dihydropyridinato ligands for the 1,4-dihydropyridinato ligands in this family of compounds results in other titanium precursors that are useful in the practice of this invention.

Analogous compounds of the metals zirconium, hafnium, vanadium, niobium, tantalum, chromium, molybdenum, tungsten, aluminum, gallium, indium, tin, arsenic, antimony and bismuth serve as precursors for chemical vapor deposition of materials containing the corresponding metals.

Analogous compounds of the semiconductors boron, silicon, germanium, selenium and tellurium serve as precursors for chemical vapor deposition of materials containing the corresponding elements.

Analogous compounds of the non-metals phosphorus and sulfur serve as precursors for chemical vapor deposition of materials containing the corresponding elements.

Suitable chemical vapor deposition apparatus for carrying out the invention is known in the art. Chemical vapor deposition processes can be operated at atmospheric pressure, or at lower pressures.

DESCRIPTION OF THE PREFERRED EMBODIMENT(S)

One preferred titanium compound source is tetrakis(1,4-dihydropyridinato)titanium

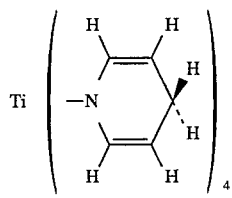

Its synthesis may be started from 1,4-dihydropyridine, which is not commercially available. The 1,4-dihydropyridine may be synthesized conveniently by the lithium aluminum hydride reduction of pyridine (described by Lansbury and Peterson in the Journal of the American Chemical Society, volume 85, page 2236, 1963) to form lithium tetrakis(1,4-dihydropyridyl)aluminate:

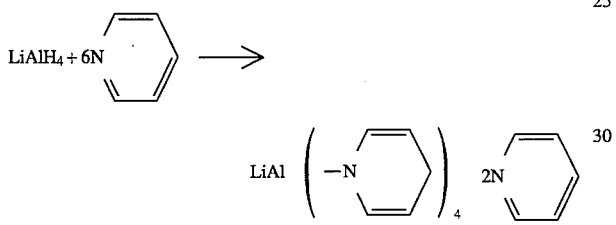

Carrying out this reaction at elevated temperatures (up to 120° C.) results in nearly pure 4H isomer, with less than one percent of the less stable 2H isomer. Hydrolysis by water of its pyridine solution results in a mixture of pyridine and the desired 1,4-dihydropyridine, which are distilled together from the hydrolysis byproducts, because the boiling points of dihydropyridine and pyridine are very close together.

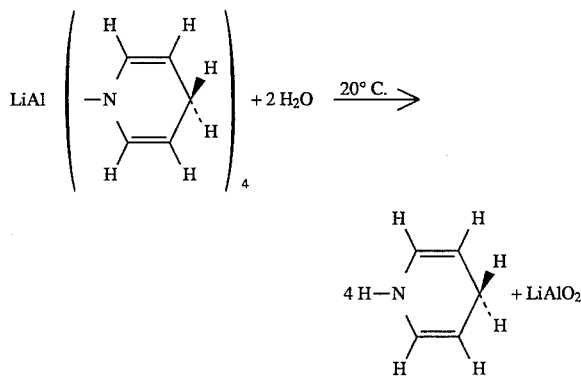

In some applications, the remaining pyridine does not cause problems with the further processing. In other cases, it may be desirable to form pure dihydropyridine, free from pyridine impurity. In such cases, a higher boiling solvent is added to the pyridine solution of lithium tetrakis(1,4-dihydropyridyl)aluminate, and the unreacted pyridine is removed by distillation at reduced pressure before the hydrolysis step. A suitable higher-boiling solvent is 1-methylimidazole, which has a boiling point of 198° C., which is much higher than that of pyridine (115° C.).

It should be noted that 1,4-dihydropyridine is very sensitive to oxygen, heat and acids, which appear to cause it to polymerize or decompose. Inhibitors, such as diphenylamine or phenothiazine, may be added to stabilize the material during distillation or storage. Most of the other compounds are also very reactive to water and oxygen. Therefore, these syntheses should exclude the ambient atmosphere, for example by careful use of Schlenk techniques and an inert-atmosphere glove box.

After preparing the 1,4-dihydropyridine, the CVD source material may be synthesized by transamination reactions, in which partially hydrogenated aromatic nitrogen-containing heterocyclic ligands replace dimethylamido ligands. This procedure is illustrated below for the case of transamination of tetrakis(dimethylamido) titanium by 1,4-dihydropyridine to form tetrakis(1,4-dihydropyridinato) titanium:

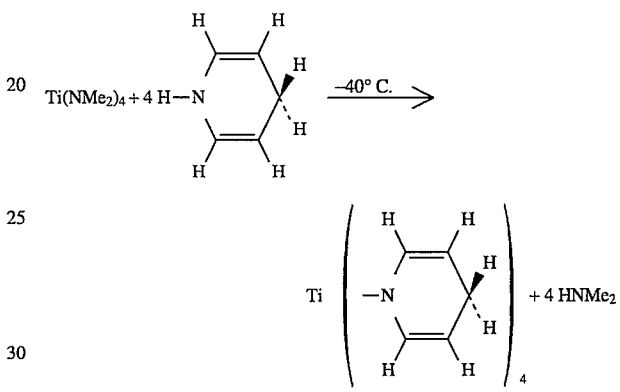

In order to carry out this reaction, the tetrakis(dimethylamido) titanium is mixed with the 1,4-dihydropyridine and stirred in a fractional distillation apparatus so that the volatile dimethylamine byproduct is vacuum-distilled out of the mixture. Similar transamination reactions may be used to form other compounds having dihydropyridine ligands.

The preferred temperature range for carrying out the CVD process varies somewhat, depending on the specific reactants and substrates. The preferred titanium compounds generally react at a substrate temperature below 500° C., more preferably below 450° C., and most preferably below 400° C. Silicon substrates bearing one or more already deposited aluminum layers should be kept below about 425° C.

The preferred carrier gas is an inert gas such as helium or argon. The preferred pressure range for operating the process will depend greatly on the particular apparatus. Apparatus designed to operate at low pressure, generally less than 0.1 atmosphere, may employ a gas distribution manifold ("showerhead") similar in size to the wafer being coated. Apparatus designed to operate at one atmosphere pressure may admit the precursor vapor through a slot under which the wafer moves on a belt. The following examples were carried out in a small laboratory reactor in which the wafer was stationary.

EXAMPLE I (1,4-dihydropyridinato)titanium compounds were prepared by the following sequence of reactions, which used Schlenk techniques to exclude atmospheric oxygen and moisture. First, 1,4-dihydropyridine was made by reaction of lithium aluminum hydride with excess pyridine. The pyridine was dried by storage over molecular sieves. 250 cubic centimeters of dry pyridine was added to 5.04 g lithium aluminum hydride and stirred until most of it dissolved. The undissolved material was mostly lithium hydride impurity in the lithium aluminum hydride. The undissolved material was filtered out and the clear solution was stirred at room temperature for one hour and then heated to reflux temperature (about 120° C.) for 12 hours. The resulting pyridine solution of lithium tetrakis(1,4-dihydropyridyl)aluminate was cooled to 20° C., 0.1 gram of diphenylamine was dissolved in the solution, and then 4.75 g of degassed water was added while stirring. The stirring was continued for 15 minutes. Trap to trap vacuum distillation was then used to remove the dihydropyridine and excess pyridine from the non-volatile hydrolysis byproducts. The resulting mixture was analyzed by nuclear magnetic resonance (NMR) to be a 10% solution of 1,4-dihydropyridine in pyridine. Five cubic centimeters of this dihydropyridine-pyridine mixture was cooled to −40° C. and 0.23 g of tetrakis(dimethylamido)titanium was added to the stirred flask. The dark red mixture was stirred under vacuum for one hour, during which time it gave off dimethylamine gas. NMR analysis of the solution indicated the presence of 1,4-dihydropyridine ligands bound to titanium (IV) in a non-magnetic compound.

A rectangular borosilicate glass reaction chamber inside dimensions 1 cm by 4 cm by 50 cm was heated from below. A silicon wafer substrate positioned on the floor of the chamber was held at a temperature of about 400° C. Pure helium gas was flowed through the chamber until the effluent gas contained less than 0.2 ppm water or oxygen.

The pyridine solution of tetrakis(1,4-dihydropyridinato) titanium was placed in the reservoir of a pneumatic atomizer held at −40° C. while a stream of pure helium precooled to −40° C. passed through the atomizer at a rate of 4 liters per minute. This created an aerosol of submicron droplets which was then passed directly into the reaction chamber. Flow of the gas mixture was maintained for a period of ten minutes. Then the substrate was cooled in a flow of pure helium.

Analysis of the deposited film by Rutherford Backscattering Spectroscopy showed that it consisted of titanium metal, along with some hydrogen, nitrogen and carbon. The film was about 20 nanometers thick and showed good conformal coverage of holes and trenches. It makes electrical contact to doped silicon, to metal silicides, such as titanium silicide, cobalt silicide and platinum silicide, and to metals, including tungsten, aluminum, copper, silver and gold. CVD tungsten, aluminum and copper nucleate on the titanium-containing material and adhere well to it.

EXAMPLE II

Example I was repeated with the borosilicate glass tube replaced with a stainless steel tube. A back-pressure regulator, set at 0.1 atmosphere, and a vacuum pump were attached to its outlet. Similar results were obtained, except that the thickness was more uniform over the sample.

EXAMPLE III

Ten grams of a 39 weight percent dihydropyridine solution in 1-methylimidazole were placed in a three-necked flask which was purged through one neck with dry nitrogen containing less than one ppm of oxygen or water vapor. Another neck held an addition funnel containing 2.4 g of tris(dimethylamido) silane (from Strem Chemicals, Newburyport, Massachusetts) which was added to the magnetically-stirred solution. The light yellow mixture was stirred at room temperature and atmospheric pressure for two days, during which time it gave off dimethylamine gas (basic to litmus test) through an oil bubbler attached to the third neck of the flask. NMR of the resulting solution confirmed that the reaction was complete, because almost all of the methyl resonance of the reactant had been removed. The resonances of the carbon-bound hydrogens in 1,4-dihydropyridine were only shifted slightly by the reaction, while the line from the nitrogen-bound hydrogen disappeared.

This 1-methylimidazole solution of tris(1,4-dihydropyridinato)silane was placed in the reservoir of a pneumatic atomizer held at 20° C. while a stream of pure nitrogen passed through the atomizer at a rate of 4 liters per minute. This created an aerosol of submicron droplets which was then passed directly into the reaction chamber of Example II. Flow of the aerosol was maintained for a period of ten minutes, while the substrate was held at a temperature of about 650° C. Then the substrate was cooled in a flow of pure nitrogen.

A shiny, smooth film adhered strongly to the substrate, as well as to the adjacent portions of the reaction chamber. Analysis of the deposited film by Rutherford Backscattering Spectroscopy showed that it consisted mainly of silicon.

With dihydropyridinato-containing derivatives of transition metals, such as zirconium, hafnium, vanadium, niobium, tantalum, chromium, molybdenum and tungsten, results similar to those of the Examples can be obtained.

With dihydropyridinato-containing derivatives of main-group metals, such as aluminum, gallium, indium, tin, arsenic, antimony and bismuth, results similar to those of the Examples can be obtained.

With dihydropyridinato-containing derivatives of the semiconductors boron, silicon, germanium, selenium and tellurium, results similar to those of the Examples can be obtained.

With dihydropyridinato-containing derivatives of non-metals, such as phosphorous and sulfur, results similar to those of the Examples can be obtained.

The foregoing description has been limited to a specific embodiment of the invention. It will be apparent, however, that variations and modifications can be made to the invention, with the attainment of some or all of the advantages of the invention. Therefore, it is the object of the appended claims to cover all such variations and modifications as come within the true spirit and scope of the invention.

Having described my invention, what I now claim is:

1. A process for the chemical vapor deposition of metal or metal-containing material comprising:

a) forming a vapor of a metal-containing compound whose molecules contain at least one bond between the metal atom and a nitrogen atom in a ligand that is derived from a partially hydrogenated aromatic, nitrogen-containing heterocyclic compound;

b) heating said vapor; and c) depositing said metal or metal-containing material on a substrate or in the form of a powder.

2. The process of claim 1 in which the metal-containing compound contains dihydropyridinato ligands selected from the group consisting of 1,4-dihydropyridinato ligands and 1,2-dihydropyridinato ligands.

3. The process of claim 1 in which the metal is selected from the group consisting of titanium, zirconium, hafnium, vanadium, niobium, tantalum, chromium, molybdenum, tungsten, aluminum, gallium, indium, tin, arsenic, antimony and bismuth.

4. The process of claim 3 wherein the metal is titanium.

5. The process of claim 1 which comprises:
mixing said vapor with an inert carrier gas.

6. A process for the chemical vapor deposition of a semiconductor or semiconductor-containing material comprising:
   a) forming a vapor of a semiconductor-containing compound whose molecules contain at least one bond between the semiconductor atom and a nitrogen atom in a ligand that is derived from a partially hydrogenated aromatic, nitrogen,containing heterocyclic compound;
   b) heating said vapor; and
   c) depositing said semiconductor or semiconductor-containing material on a substrate or in the form of a powder.

7. The process of claim 6 in which the semiconductor containing compound contains dihydropyridinato ligands selected from the group comprising 1,4-dihydropyridinato ligands and 1,2-dihydropyridinato ligands.

8. The process of claim 6 in which the semiconductor is selected from the group consisting of boron, silicon, germanium, selenium and tellurium.

9. The process of claim 6, which comprises:
mixing said vapor with an inert carrier gas.

10. A process for the chemical vapor-deposition of a non-metal or non-metal-containing material comprising:
    a) forming a vapor of a non-metal-containing compound in which the non-metal is selected from the group consisting of phosphorous and sulfur and whose molecules contain at least one bond between the non-metal atom and a nitrogen atom in a ligand that is derived from a partially hydrogenated aromatic, nitrogen-containing heterocyclic compound;
    b) heating said vapor; and
    c) depositing said non-metal or non-metal-containing material on a substrate or in the form of a powder.

11. The process of claim 10 in which the non-metal containing compound contains dihydropyridinato ligands selected from the group consisting of 1,4-dihydropyridinato ligands and 1,2-dihydropyridinato ligands.

12. The process of claim 10 which comprises:
mixing said vapor with an inert carrier gas.

* * * * *